US012307385B2

(12) United States Patent
Bhide et al.

(10) Patent No.: US 12,307,385 B2
(45) Date of Patent: May 20, 2025

(54) EXPLAINING ACCURACY DRIFT IN PRODUCTION DATA

(71) Applicant: International Business Machines Corporation, Armonk, NY (US)

(72) Inventors: Manish Anand Bhide, Hyderabad (IN); Pranay Kumar Lohia, Bhagalapur (IN); Diptikalyan Saha, Bangalore (IN); Madhavi Katari, Hyderabad (IN)

(73) Assignee: International Business Machines Corporation, Armonk, NY (US)

( * ) Notice: Subject to any disclaimer, the term of this patent is extended or adjusted under 35 U.S.C. 154(b) by 1186 days.

(21) Appl. No.: 16/813,512

(22) Filed: Mar. 9, 2020

(65) Prior Publication Data

US 2021/0279607 A1     Sep. 9, 2021

(51) Int. Cl.
*G06N 5/04* (2023.01)
*G06F 30/27* (2020.01)
*G06N 5/01* (2023.01)
*G06N 5/02* (2023.01)
*G06N 20/00* (2019.01)

(52) U.S. Cl.
CPC ............ *G06N 5/04* (2013.01); *G06F 30/27* (2020.01); *G06N 5/01* (2023.01); *G06N 5/02* (2013.01); *G06N 20/00* (2019.01)

(58) Field of Classification Search
CPC . G06N 5/04; G06N 20/00; G06N 5/01; G06F 30/27
See application file for complete search history.

(56) References Cited

U.S. PATENT DOCUMENTS

| 2017/0103340 | A1  | 4/2017  | Zoldi et al. |
| 2017/0330109 | A1* | 11/2017 | Maughan ................ G06N 5/04 |
| 2017/0372232 | A1* | 12/2017 | Maughan .............. G06F 3/0482 |
| 2018/0322406 | A1  | 11/2018 | Merrill et al. |
| 2019/0156216 | A1  | 5/2019  | Gupta et al. |

* cited by examiner

*Primary Examiner* — Kevin W Figueroa
(74) *Attorney, Agent, or Firm* — Zilka-Kotab, P.C.

(57) ABSTRACT

A computer-implemented method according to one embodiment includes identifying an occurrence of accuracy drift by a trained model; identifying data associated with the accuracy drift, utilizing a drift detection model (DDM) constructed for the trained model; applying the data associated with the accuracy drift to a decision tree to determine a feature space and specific subset of the data causing the accuracy drift; analyzing a distribution of features within the feature space for the specific subset of the data causing the accuracy drift to determine specific features of the data causing the accuracy drift; and returning the specific features of the data causing the accuracy drift.

19 Claims, 4 Drawing Sheets

EXPLAINING ACCURACY DRIFT IN PRODUCTION DATA

BACKGROUND

The present invention relates to machine learning models, and more specifically, this invention relates to identifying a source of accuracy drift by a machine learning model.

Machine learning models are commonly used for implementing a variety of operations, including classification, identification, etc. Ensuring that these models are running correctly is of high importance. When a trained machine learning model exhibits accuracy drift, it is desirable to know the source of such accuracy drift so that adjustments may be made to avoid such accuracy drift in the future.

SUMMARY

A computer-implemented method according to one embodiment includes identifying an occurrence of accuracy drift by a trained model; identifying data associated with the accuracy drift, utilizing a drift detection model (DDM) constructed for the trained model; applying the data associated with the accuracy drift to a decision tree to determine a feature space and specific subset of the data causing the accuracy drift; analyzing a distribution of features within the feature space for the specific subset of the data causing the accuracy drift to determine specific features of the data causing the accuracy drift; and returning the specific features of the data causing the accuracy drift.

According to another embodiment, a computer program product for explaining accuracy drift in production data includes a computer readable storage medium having program instructions embodied therewith, where the computer readable storage medium is not a transitory signal per se, and where the program instructions are executable by a processor to cause the processor to perform a method including identifying, by the processor, an occurrence of accuracy drift by a trained model; identifying, by the processor, data associated with the accuracy drift, utilizing a drift detection model (DDM) constructed for the trained model; applying, by the processor, the data associated with the accuracy drift to a decision tree to determine a feature space and specific subset of the data causing the accuracy drift; analyzing, by the processor, a distribution of features within the feature space for the specific subset of the data causing the accuracy drift to determine specific features of the data causing the accuracy drift; and returning, by the processor, the specific features of the data causing the accuracy drift.

A system according to another embodiment includes a processor; and logic integrated with the processor, executable by the processor, or integrated with and executable by the processor, where the logic is configured to identify an occurrence of accuracy drift by a trained model; identify data associated with the accuracy drift, utilizing a drift detection model (DDM) constructed for the trained model; apply the data associated with the accuracy drift to a decision tree to determine a feature space and specific subset of the data causing the accuracy drift; analyze a distribution of features within the feature space for the specific subset of the data causing the accuracy drift to determine specific features of the data causing the accuracy drift; and return the specific features of the data causing the accuracy drift.

Other aspects and embodiments of the present invention will become apparent from the following detailed description, which, when taken in conjunction with the drawings, illustrate by way of example the principles of the invention.

DETAILED DESCRIPTION

Figure 1:
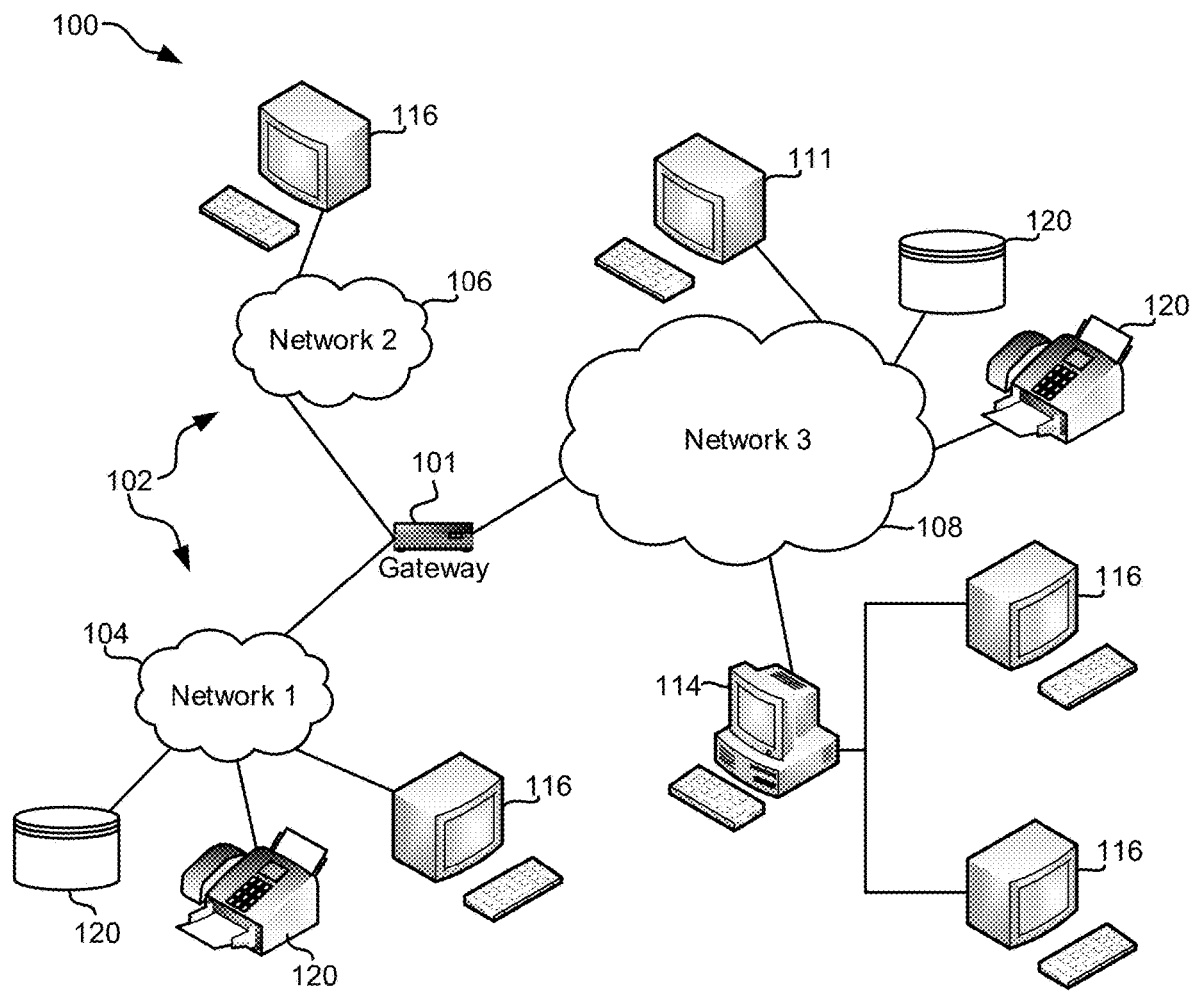
FIG. 1 illustrates a network architecture, in accordance with one embodiment of the present invention.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified. It will be further understood that the terms "includes" and/or "comprising," when used in this specification, specify the presence of stated features, integers, steps, operations, elements, and/or components, but do not preclude the presence or addition of one or more other features, integers, steps, operations, elements, components, and/or groups thereof.

The following description discloses several preferred embodiments of systems, methods and computer program products for explaining accuracy drift in production data.

In one general embodiment, a computer-implemented method includes identifying an occurrence of accuracy drift by a trained model; identifying data associated with the accuracy drift, utilizing a drift detection model (DDM) constructed for the trained model; applying the data associated with the accuracy drift to a decision tree to determine a feature space and specific subset of the data causing the accuracy drift; analyzing a distribution of features within the feature space for the specific subset of the data causing the accuracy drift to determine specific features of the data causing the accuracy drift; and returning the specific features of the data causing the accuracy drift.

In another general embodiment, a computer program product for explaining accuracy drift in production data includes a computer readable storage medium having program instructions embodied therewith, where the computer readable storage medium is not a transitory signal per se, and where the program instructions are executable by a processor to cause the processor to perform a method including identifying, by the processor, an occurrence of accuracy drift by a trained model; identifying, by the processor, data associated with the accuracy drift, utilizing a drift detection model (DDM) constructed for the trained model; applying, by the processor, the data associated with the accuracy drift to a decision tree to determine a feature space and specific subset of the data causing the accuracy drift; analyzing, by the processor, a distribution of features within the feature space for the specific subset of the data causing the accuracy drift to determine specific features of the data causing the accuracy drift; and returning, by the processor, the specific features of the data causing the accuracy drift.

In another general embodiment, a system includes a processor; and logic integrated with the processor, executable by the processor, or integrated with and executable by the processor, where the logic is configured to identify an occurrence of accuracy drift by a trained model; identify data associated with the accuracy drift, utilizing a drift detection model (DDM) constructed for the trained model; apply the data associated with the accuracy drift to a decision tree to determine a feature space and specific subset of the data causing the accuracy drift; analyze a distribution of features within the feature space for the specific subset of the data causing the accuracy drift to determine specific features of the data causing the accuracy drift; and return the specific features of the data causing the accuracy drift.

FIG. 1 illustrates an architecture 100, in accordance with one embodiment. As shown in FIG. 1, a plurality of remote networks 102 are provided including a first remote network 104 and a second remote network 106. A gateway 101 may be coupled between the remote networks 102 and a proximate network 108. In the context of the present architecture 100, the networks 104, 106 may each take any form including, but not limited to a LAN, a WAN such as the Internet, public switched telephone network (PSTN), internal telephone network, etc.

In use, the gateway 101 serves as an entrance point from the remote networks 102 to the proximate network 108. As such, the gateway 101 may function as a router, which is capable of directing a given packet of data that arrives at the gateway 101, and a switch, which furnishes the actual path in and out of the gateway 101 for a given packet.

Further included is at least one data server 114 coupled to the proximate network 108, and which is accessible from the remote networks 102 via the gateway 101. It should be noted that the data server(s) 114 may include any type of computing device/groupware. Coupled to each data server 114 is a plurality of user devices 116. User devices 116 may also be connected directly through one of the networks 104, 106, 108. Such user devices 116 may include a desktop computer, lap-top computer, hand-held computer, printer or any other type of logic. It should be noted that a user device 111 may also be directly coupled to any of the networks, in one embodiment.

A peripheral 120 or series of peripherals 120, e.g., facsimile machines, printers, networked and/or local storage units or systems, etc., may be coupled to one or more of the networks 104, 106, 108. It should be noted that databases and/or additional components may be utilized with, or integrated into, any type of network element coupled to the networks 104, 106, 108. In the context of the present description, a network element may refer to any component of a network.

According to some approaches, methods and systems described herein may be implemented with and/or on virtual systems and/or systems which emulate one or more other systems, such as a UNIX system which emulates an IBM z/OS environment, a UNIX system which virtually hosts an operating system environment, an operating system which emulates an IBM® z/OS environment (IBM and all IBM-based trademarks and logos are trademarks or registered trademarks of International Business Machines Corporation and/or its affiliates), etc. This virtualization and/or emulation may be enhanced through the use of VMWARE software, in some embodiments.

In more approaches, one or more networks 104, 106, 108, may represent a cluster of systems commonly referred to as a "cloud." In cloud computing, shared resources, such as processing power, peripherals, software, data, servers, etc., are provided to any system in the cloud in an on-demand relationship, thereby allowing access and distribution of services across many computing systems. Cloud computing typically involves an Internet connection between the systems operating in the cloud, but other techniques of connecting the systems may also be used.

Figure 2:
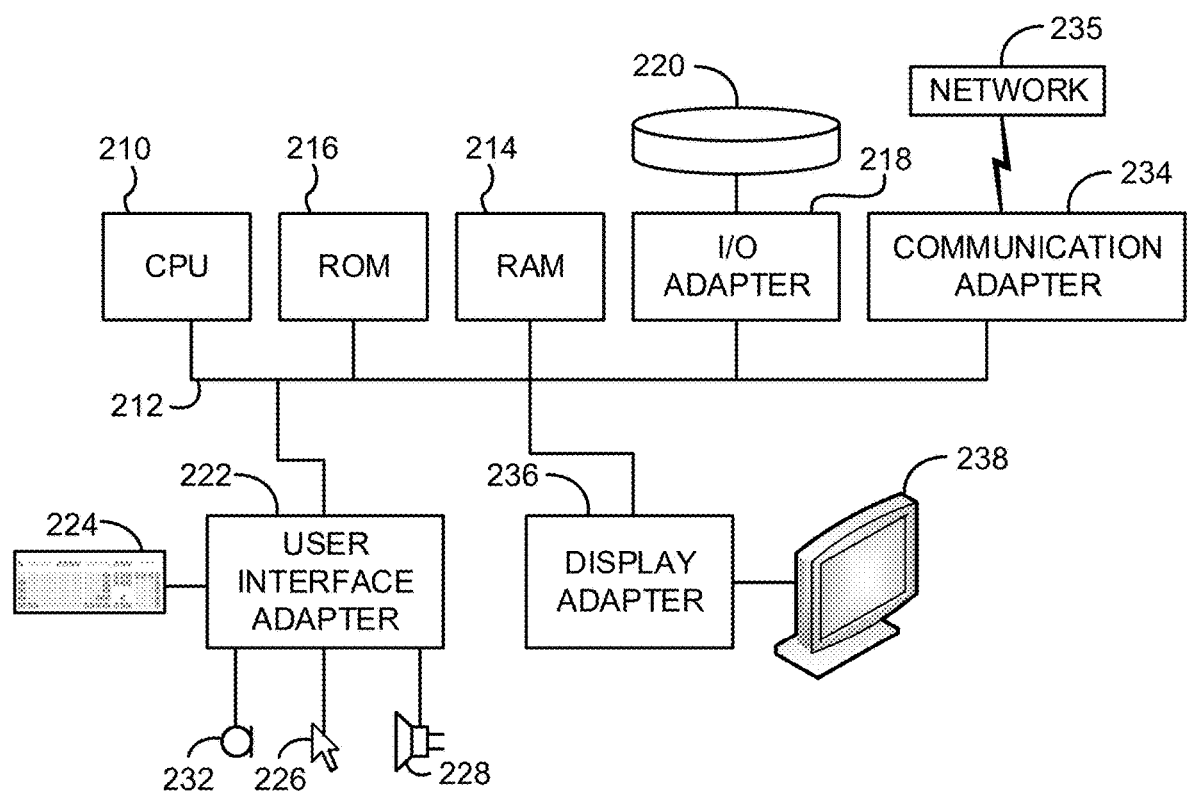
FIG. 2 shows a representative hardware environment that may be associated with the servers and/or clients of FIG. 1, in accordance with one embodiment of the present invention.

FIG. 2 shows a representative hardware environment associated with a user device 116 and/or server 114 of FIG. 1, in accordance with one embodiment. Such figure illustrates a typical hardware configuration of a workstation having a central processing unit 210, such as a microprocessor, and a number of other units interconnected via a system bus 212.

The workstation shown in FIG. 2 includes a Random Access Memory (RAM) 214, Read Only Memory (ROM) 216, an I/O adapter 218 for connecting peripheral devices such as disk storage units 220 to the bus 212, a user interface adapter 222 for connecting a keyboard 224, a mouse 226, a speaker 228, a microphone 232, and/or other user interface devices such as a touch screen and a digital camera (not shown) to the bus 212, communication adapter 234 for connecting the workstation to a communication network 235 (e.g., a data processing network) and a display adapter 236 for connecting the bus 212 to a display device 238.

The workstation may have resident thereon an operating system such as the Microsoft Windows® Operating System (OS), a MAC OS, a UNIX OS, etc. It will be appreciated that a preferred embodiment may also be implemented on platforms and operating systems other than those mentioned. A preferred embodiment may be written using XML, C, and/or C++ language, or other programming languages, along with an object oriented programming methodology. Object oriented programming (OOP), which has become increasingly used to develop complex applications, may be used.

Figure 3:
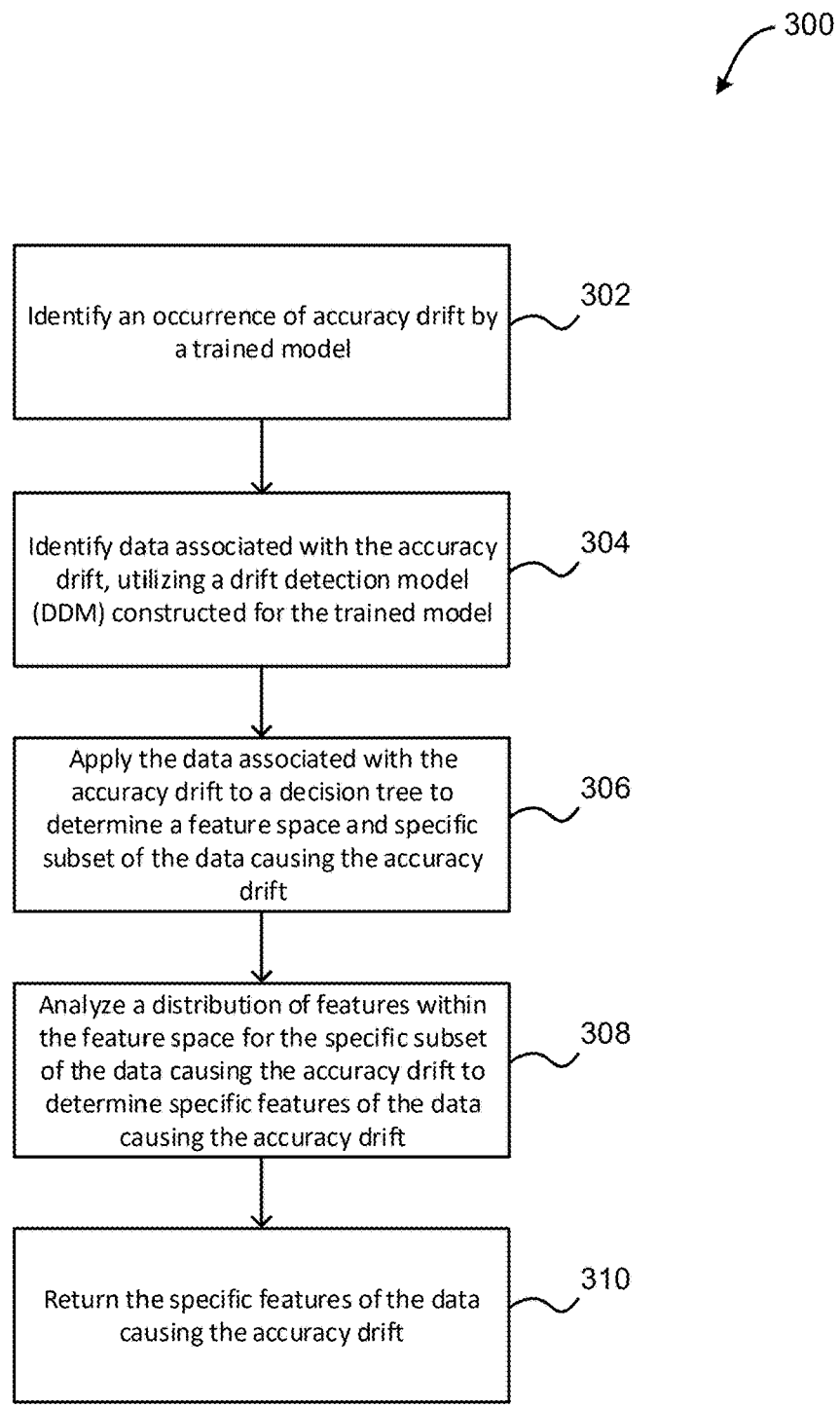
FIG. 3 illustrates a method for explaining accuracy drift in production data, in accordance with one embodiment of the present invention.

Now referring to FIG. 3, a flowchart of a method 300 is shown according to one embodiment. The method 300 may be performed in accordance with the present invention in any of the environments depicted in FIGS. 1-2, among others, in various embodiments. Of course, greater or fewer operations than those specifically described in FIG. 3 may be included in method 300, as would be understood by one of skill in the art upon reading the present descriptions.

Each of the steps of the method 300 may be performed by any suitable component of the operating environment. For example, in various embodiments, the method 300 may be partially or entirely performed by one or more servers, computers, or some other device having one or more processors therein. The processor, e.g., processing circuit(s), chip(s), and/or module(s) implemented in hardware and/or software, and preferably having at least one hardware component may be utilized in any device to perform one or more steps of the method 300. Illustrative processors include, but are not limited to, a central processing unit (CPU), an application specific integrated circuit (ASIC), a field programmable gate array (FPGA), etc., combinations thereof, or any other suitable computing device known in the art.

As shown in FIG. 3, method 300 may initiate with operation 302, where an occurrence of accuracy drift by a trained model is identified. In one embodiment, the trained model may include a machine learning model (e.g., a neural network, etc.). In another embodiment, the trained model may include a customer model (e.g., a model created and trained for implementation by a customer, etc.).

Additionally, in one embodiment, trained model may be initially trained utilizing input training data (e.g., data such as text, images, etc. that have associated ground truth labels known to be correct). In another embodiment, the trained model may be verified using test data. For example, a first portion of the test data may be used as training data, and the remaining portion of the test data may be used to validate the trained model to ensure that the trained model outputs correct information.

Further, in one embodiment, the trained model may take data (e.g., one or more of text, images, etc.) as input, and may output one or more labels for the input data, one or more classifications for the input data, etc. In another embodiment, after the trained model is verified, the trained model may be implemented by inputting production data into the trained model.

For example, the production data may include data from one or more data sources (e.g., a continuously updated database, a streaming news source, etc.). In another example, the production data may have an associated time element/temporal component (e.g., a time when the data was created, etc.). In yet another example, the production data may have a plurality of features. For instance, each instance of the production data may have a plurality of aspects (exemplary aspects include data source, age, occupation, physical location, temperature, etc.).

Further still, in one embodiment, the production data may be incremental production data. For example, the production data may consist of a plurality of different stages, where different portions of the production data are received and input into the trained model at each of the different stages. In another embodiment, trained model may take the production data as input and may produce one or more instances of output (e.g., one or more labels, etc.) based on the input.

Also, in one embodiment, the trained model may also compute its associated accuracy. For example, the trained model may output one or more accuracy statistics in addition to its other output (e.g., labels, etc.). In another example, an occurrence of accuracy drift may be identified in response to the one or more accuracy statistics falling below a predetermined threshold.

In addition, in one embodiment, an accuracy of the trained model may be computed externally. For example, output of the trained model (e.g., one or more labels or other values) may be compared to verified output (e.g., one or more user-verified labels, etc.). In another example, an occurrence of accuracy drift may be identified in response to the computed accuracy falling below a predetermined threshold.

Furthermore, in one embodiment, the identification of the accuracy drift may trigger an analysis routine to determine a cause of the accuracy drift. In another embodiment, the accuracy drift may include a fluctuation in an accuracy of the trained model during the implementation of the trained model. For example, an accuracy of the trained model may fall below a predetermined threshold when the trained model processes input production data.

In another embodiment, the accuracy drift may include a fluctuation in an accuracy of the trained model when the trained model processes a plurality of different data sets (e.g., incremental data sets). For example, the trained model may be determined to have a first accuracy when processing a first incremental data set, and the trained model may be determined to have a second accuracy when processing a second incremental data set separate from the first incremental data set. The occurrence of accuracy drift may be identified in response to determining that a different between the first accuracy and the second accuracy exceeds a predetermined threshold value.

Further still, method 300 may proceed with operation 304, where data associated with the accuracy drift is identified utilizing a drift detection model (DDM) constructed for the trained model. In one embodiment, the DDM may be created as a pseudo-model (or surrogate model) based on the trained model. For example, the trained model may be incorporated into the DDM. In another embodiment, the DDM may include a machine learning model that identifies changing prediction values created by the trained model for input production data.

Also, in one embodiment, the production data input into the trained model during the occurrence of accuracy drift may be identified and may be input into the DDM. In another embodiment, DDM may monitor prediction values for the input production data over time. For example, the DDM may identify changing prediction values for the input production data over a predetermined time period (e.g., utilizing the temporal component of the input production data, etc.).

Additionally, in one embodiment, based on the monitoring of the prediction values, the DDM may identify that the input production data is causing the accuracy drift. For example, it may be determined that input production data is causing the accuracy drift in response to the DDM identifying a change in prediction values of the trained model above a predetermined threshold in response to the input production data.

Further, in one embodiment, based on the monitoring of the prediction values, the DDM may identify a portion of the input production data that is associated with the accuracy drift. For example, input production data that causes a change in prediction values above a predetermined threshold may be identified as being associated with the accuracy drift. In another embodiment, the DDM may return an indication that the input production data is causing the accuracy drift. In yet another embodiment, the DDM may also return an indication of the portion of the input production data that is associated with the accuracy drift.

Further still, method 300 may proceed with operation 306, where the data associated with the accuracy drift is applied to a decision tree to determine a feature space and specific subset of the data causing the accuracy drift. In one embodiment, the decision tree may include another machine learning model. In another embodiment, the decision tree may apply labels to the data associated with the accuracy drift after applying a series of tests to the data.

Also, in one embodiment, the decision tree may take the portion of the input production data that is associated with the accuracy drift as input. In another embodiment, the decision tree may analyze the data associated with the accuracy drift and may output the feature space and specific subset of the input data causing the accuracy drift. For example, the feature space of the data may include one or more specific features (e.g., aspects, categories, etc.) of the data. In another example, exemplary features may include age, occupation, physical location, temperature, etc.

In addition, in one embodiment, the decision tree may output an identification of the feature space causing the accuracy drift (e.g., the top N features of the input data causing the accuracy drift). In another embodiment, the decision tree may output a specific subset of the input production data associated with the accuracy drift that is specifically causing the accuracy drift.

Furthermore, method 300 may proceed with operation 308, where a distribution of features within the feature space for the specific subset of the data causing the accuracy drift is analyzed to determine specific features of the data causing the accuracy drift. In one embodiment, a distribution of each feature of the specific subset of data causing the accuracy drift may be compared to a distribution of each corresponding feature of the training data used to initially train the trained model.

Further still, in one embodiment, a change in distribution between each feature of the training data and the corresponding feature of the specific subset of data causing the drift may be determined. In another embodiment, features having a change in distribution exceeding a predetermined threshold may be identified as features causing the accuracy drift.

Also, method 300 may proceed with operation 310, where the specific features of the data causing the accuracy drift are returned. In one embodiment, a message identifying the specific features causing the accuracy drift may be returned to one or more users. For example, the message may be sent to the user in response to an accuracy check request sent by the user.

Additionally, in one embodiment, the message may also include an identification of the change in distribution between each feature of the training data and the corresponding feature of the specific subset of data causing the drift. In another embodiment, one or more remedial measures may be performed in response to the determination of the specific features causing the accuracy drift. For example, the features causing the accuracy drift may be removed or otherwise ignored by the trained model. In another example, the trained model may be adjusted to account for the features causing the accuracy drift.

In this way, specific features of production data causing accuracy drift within a trained model may be identified. Additionally, the model and/or the production data may be adjusted to account for the features causing the accuracy drift. In this way, a performance of the trained model may be improved, which may improve a performance of one or more hardware devices implementing the trained model.

Explaining Accuracy Drift in Incremental Production Data

After training a model on training data, in a post processing stage, an accuracy check of such trained model may be performed on production data (e.g., payload/production samples) which may be retrieved from different sources at different times. When a trained model suffers from accuracy drift or prediction classification error, it is desirable to know the cause of this drift, and which stage in the production data has produced this drift.

Accuracy drift can occur as a result of multiple issues such as:
Production data from a different distribution
Production data from a different source
Training of an inaccurate model A detailed explanation is desirable so that production data or the model can be fixed to prevent the accuracy drift from persisting or increasing over time.

In one embodiment, an ability to explain accuracy drift in incremental production data is provided. In another embodiment, an ability to explain accuracy drift in incremental production data with different versions of a trained mode (e.g., a customer model such as a classification model) is also provided. In yet another embodiment, a feature space of a customer model that is causing accuracy drift in the incremental production data may be identified. In another embodiment, a change in the distribution of the feature space of the customer model (e.g., a classification model) which is the reason for accuracy drift in the incremental production data may be identified.

In one embodiment, predictions in the training data which are likely incorrect by the customer model are detected. Additionally, in another embodiment, drift may include a predict-classification error. Further, in one embodiment, a surrogate model (such as a drift detection model (DDM)) may be constructed to predict drift using training data for the customer model. Further still, in one embodiment, production data may be annotated with surrogate model output as data causing or note causing accuracy drift.

An exemplary method for explaining accuracy drift is provided below:

Post deployment of a trained model, production data at the n-1th stage is called Prod n−1
The production data at the nth stage is called Prod n
Prodn-1=Accuracy_Driftn-1+Non-Driftn-1
Prodn=Accuracy Driftn+Non-Driftn
Create a decision tree DTn-1 with class: Accuracy_Driftn-1, Non-Drift (of Prodn-1, Prodn-2, Training, Testing).
Drifted paths (Ends with Driftn-1) in DTn-1 represents the feature space for drift in Prodn-1 (represented by the set Pn-1)
C=Points in Driftn that are satisfied by Pn-1 (any path accepts a sample in C).
Create a decision tree DTn with class: Acciracy_Driftn-C, Non-Drift (of Prodn-1, Prodn, Training, Testing).
Drifted paths in DTn (Ends with Driftn-C) represents the exclusive feature space for drift in Prodn (=Pn)
Output Pn (or with necessary projection with number of important attributes, distributions)

Figure 4:
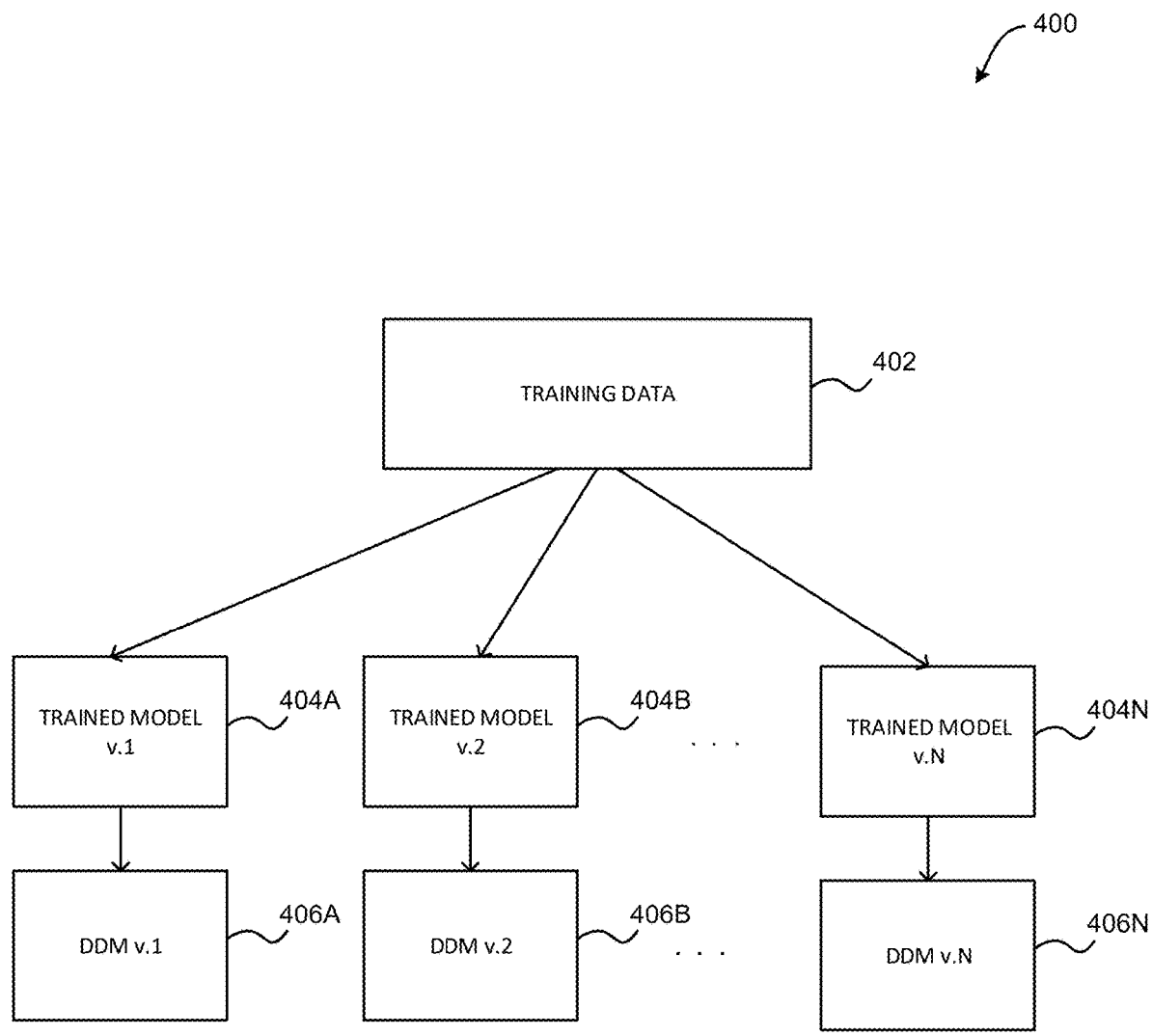
FIG. 4 illustrates the implementation of drift detection models for multiple customer models, in accordance with one embodiment of the present invention.

FIG. 4 illustrates the implementation 400 of drift detection models for multiple customer models 404A-N, according to one exemplary embodiment. As shown, a plurality of different versions of customer models 404A-N are trained utilizing a corpus of training data 402. Drift detection models 406A-N are then constructed for the customer models 404A-N. In this way, drift detection models may be prepared for performing accuracy drift analysis for any of the plurality of different versions of customer models 404A-N if accuracy drift is detected in one or more of the customer models 404A-N.

In one embodiment, a global identification may be provided as to how accuracy drift is occurring due to incorrect decision boundaries. Additionally, a top contributing feature space to accuracy drift may be identified using a decision tree. A region and range-based explanation may also be provided. The Decision Tree may be built on the drifted points of production data (with drift as a class label) and non-drifted points of production, training and test data. A top contributing feature space (e.g., a feature and its region/range) and its distributions are identified from the drifted paths obtained from the decision model explaining the exclusive region of drift occurring in the production data.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Moreover, a system according to various embodiments may include a processor and logic integrated with and/or executable by the processor, the logic being configured to perform one or more of the process steps recited herein. The processor may be of any configuration as described herein, such as a discrete processor or a processing circuit that includes many components such as processing hardware, memory, I/O interfaces, etc. By integrated with, what is meant is that the processor has logic embedded therewith as hardware logic, such as an application specific integrated circuit (ASIC), a FPGA, etc. By executable by the processor, what is meant is that the logic is hardware logic; software logic such as firmware, part of an operating system, part of an application program; etc., or some combination of hardware and software logic that is accessible by the processor and configured to cause the processor to perform some functionality upon execution by the processor. Software logic may be stored on local and/or remote memory of any memory type, as known in the art. Any processor known in the art may be used, such as a software processor module and/or a hardware processor such as an ASIC, a FPGA, a central processing unit (CPU), an integrated circuit (IC), a graphics processing unit (GPU), etc.

It will be clear that the various features of the foregoing systems and/or methodologies may be combined in any way, creating a plurality of combinations from the descriptions presented above.

It will be further appreciated that embodiments of the present invention may be provided in the form of a service deployed on behalf of a customer to offer service on demand.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A computer-implemented method, comprising:
    using one of a plurality of trained machine learning models to identify an occurrence of accuracy drift, wherein the trained machine learning models are, individually, produced by:
        causing a respective initial machine learning model to be trained using input training data, and
        causing the respective trained machine learning model to be verified using testing data;
    identifying data associated with the accuracy drift, utilizing a drift detection model (DDM) constructed for the one of the trained machine learning models, wherein each of the trained machine learning models has a respective constructed DDM;
    applying the data associated with the accuracy drift to a decision tree having a supplemental machine learning model trained to determine a feature space and specific subset of the data causing the accuracy drift;
    analyzing a distribution of features within the feature space for the specific subset of the data causing the accuracy drift to determine specific features of the data causing the accuracy drift;
    returning the specific features of the data causing the accuracy drift;
    removing the specific features of the data causing the accuracy drift from the one of the trained machine learning models; and
    causing the one of the trained machine learning models to ignore the specific features of the data causing the accuracy drift.

2. The computer-implemented method of claim 1, wherein the trained machine learning models are different versions of a base machine learning model with respect to one another.

3. The computer-implemented method of claim 1, wherein after the trained machine learning models are verified, the trained machine learning models are implemented by inputting production data therein, wherein the production data includes incremental production data, wherein the respective DDMs are independently constructed for the respective trained machine learning models associated therewith.

4. The computer-implemented method of claim 1, wherein the trained machine learning models output one or more accuracy statistics, and the occurrence of accuracy drift is identified in response to the one or more accuracy statistics falling below a predetermined threshold.

5. The computer-implemented method of claim 1, wherein the DDMs include the respective trained machine learning models that identify changing prediction values created for input production data.

6. The computer-implemented method of claim 1, wherein the DDMs are configured to:
    monitor prediction values for input production data over time; and
    identify that the input production data is causing the accuracy drift, based at least in part on the monitoring, wherein the DDMs are coupled to the respective trained machine learning models associated therewith.

7. The computer-implemented method of claim 1, wherein the DDMs are configured to determine that input production data is causing the accuracy drift in response to identifying a change in prediction values of the respective trained models above a predetermined threshold.

8. The computer-implemented method of claim 1, wherein the DDMs are configured to return an indication that input production data is causing the accuracy drift, as well as an indication of a portion of the input production data that is associated with the accuracy drift.

9. The computer-implemented method of claim 1, wherein the supplemental machine learning model is configured to:
    analyze the data associated with the accuracy drift; and
    output the feature space and specific subset of input data causing the accuracy drift.

10. The computer-implemented method of claim 1, wherein:
    distributions of features of the specific subset of data causing the accuracy drift are compared to respective distributions of corresponding features of training data used to initially train the trained model,
    a change in the distribution between features of the training data and the corresponding features of the specific subset of data causing the accuracy drift is determined, and
    features having a change in distribution exceeding a predetermined threshold are identified as features causing the accuracy drift.

11. The computer-implemented method of claim 1, further comprising performing one or more remedial measures in response to the determination of the specific features of the data causing the accuracy drift.

12. A computer program product for explaining accuracy drift in production data, the computer program product comprising a computer readable storage medium having program instructions embodied therewith, wherein the computer readable storage medium is not a transitory signal per se, the program instructions executable by a processor to cause the processor to perform a method comprising:
    using, by the processor, one of a plurality of trained machine learning models to identify an occurrence of accuracy drift, wherein the trained machine learning models are, individually, produced by:
        causing a respective initial machine learning model to be trained using input training data, and causing the respective trained machine learning model to be verified using testing data;

identifying, by the processor, data associated with the accuracy drift, utilizing a drift detection model (DDM) constructed for the one of the trained machine learning models, wherein each of the trained machine learning models has a respective constructed DDM;

applying, by the processor, the data associated with the accuracy drift to a decision tree having a supplemental machine learning model trained to determine a feature space and specific subset of the data causing the accuracy drift;

analyzing, by the processor, a distribution of features within the feature space for the specific subset of the data causing the accuracy drift to determine specific features of the data causing the accuracy drift;

returning, by the processor, the specific features of the data causing the accuracy drift;

removing the specific features of the data causing the accuracy drift from the one of the trained machine learning models; and causing the one of the trained machine learning models to ignore the specific features of the data causing the accuracy drift.

13. The computer program product of claim 12, wherein the program instructions are executable by the processor to cause the processor to perform the method further comprising:

causing the trained machine learning models to be implemented by inputting production data therein, wherein the production data includes incremental production data, wherein the trained machine learning models are different versions of a base machine learning model with respect to one another.

14. The computer program product of claim 12, wherein the trained machine learning models are configured to output one or more accuracy statistics and labels, wherein the occurrence of accuracy drift is identified in response to the one or more accuracy statistics falling below a predetermined threshold.

15. The computer program product of claim 12, wherein the DDMs include respective trained machine learning models that are configured to identify changing prediction values created by the trained machine learning models for input production data, wherein the respective DDMs are independently constructed for the machine learning models associated therewith.

16. The computer program product of claim 12, wherein the DDMs are configured to:

monitor prediction values for input production data over time;

identify ones of the prediction values that are changing for the input production data over a predetermined time period; and identify that the input production data is causing the accuracy drift, based at least in part on the identified changing prediction values.

17. The computer program product of claim 12, wherein the DDMs are configured to determine that input production data is causing the accuracy drift in response to identifying a change in prediction values of the respective trained models above a predetermined threshold, wherein the DDMs are electrically coupled to the respective trained machine learning models associated therewith.

18. A system, comprising:

a processor; and logic integrated with the processor, executable by the processor, or integrated with and executable by the processor, the logic being configured to:

use one of a plurality of trained machine learning models to identify an occurrence of accuracy drift, wherein the trained machine learning models are, individually, produced by:

causing a respective initial machine learning model to be trained using input training data, and causing the respective trained machine learning model to be verified using testing data;

use a drift detection model (DDM) constructed for the one of the trained machine learning models to identify data associated with the accuracy drift, wherein each of the trained machine learning models has a respective constructed DDM;

apply the data associated with the accuracy drift to a decision tree having a supplemental machine learning model trained to determine a feature space and specific subset of the data causing the accuracy drift;

analyze a distribution of features within the feature space for the specific subset of the data causing the accuracy drift to determine specific features of the data causing the accuracy drift;

return the specific features of the data causing the accuracy drift;

remove the specific features of the data causing the accuracy drift from the one of the trained machine learning models; and cause the one of the trained machine learning models to ignore the specific features of the data causing the accuracy drift.

19. The system of claim 18, wherein the logic is further configured to:

cause the initial machine learning model to be implemented by inputting production data therein, wherein the production data includes incremental production data, wherein the decision tree and supplemental machine learning model are formed using: production data with accuracy drift, production data without accuracy drift, the input training data, and the testing data, wherein the supplemental machine learning model is trained to determine the feature space and corresponding distributions of the feature space.

* * * * *